United States Patent [19]
Van der Kloot et al.

[11] Patent Number: 4,816,750
[45] Date of Patent: Mar. 28, 1989

[54] AUTOMATIC CIRCUIT TESTER CONTROL SYSTEM

[75] Inventors: Robert H. Van der Kloot, Medford; Ernest P. Walker; David L. Sulman, both of Weston, all of Mass.

[73] Assignee: Teradyne, Inc., Boston, Mass.

[21] Appl. No.: 3,831

[22] Filed: Jan. 16, 1987

[51] Int. Cl.$^4$ .......................................... G01R 31/28
[52] U.S. Cl. ................................... 324/73 R; 371/20
[58] Field of Search ....................... 324/73 R, 73 AT; 371/20, 15, 16

[56] References Cited
U.S. PATENT DOCUMENTS
4,402,055  8/1983  Lloyd et al. .................. 324/73 AT Primary Examiner—Ernest F. Karlsen

[57] ABSTRACT

Apparatus for providing high speed control of digital test patterns and analog instruments in automatic circuit testing apparatus including a sequence controller including a random access memory ("RAM") for microcode and an address generator for selectively addressing instructions in said random access memory, a sequence address bus connected to the address generator of the sequence controller, digital test pattern RAM connected to the sequence address bus, and analog instruments including associated RAM loaded with microcode for the instruments and connected to the sequence address bus.

8 Claims, 1 Drawing Sheet

AUTOMATIC CIRCUIT TESTER CONTROL SYSTEM

FIELD OF THE INVENTION

The invention relates to controlling apparatus for automatically testing electronic circuits.

BACKGROUND OF THE INVENTION

In apparatus for automatically testing electronic circuits (e.g., analog VLSI devices), test patterns are stored in memory and used to provide input test signals applied to nodes of a circuit under test ("CUT"), and the resulting outputs from the CUT are compared with expected outputs. Test apparatus can also include such analog instruments as high frequency and low frequency signal generators to provide analog test signals to the CUT and high and low frequency digitizers and associated capture memory to digitize and store results.

In order to simultaneously provide control signals for the test apparatus and deliver a large number of bits of data to the CUT synchronously with the clocking of the CUT at its high rate, a high speed sequence controller is used to provide the control bits (also referred to as "microcode" herein) and data bits in parallel at high speed. (The microcode plus data bits at a given clock period are referred to as a "vector".) The control bits are included in a random access memory ("RAM") in the sequence controller, for example, 16K deep to provide 16K instruction steps that can be randomly accessed upon providing the appropriate address to the RAM on an address bus controlled by an address generator in the sequence controller. The test patterns are located in RAMs distributed across separate boards and accessed by the same address bus, often referred to as a "state bus".

In test apparatus providing and detecting mixed digital and analog signals, analog instruments have been controlled by bits of the sequence controller RAM assigned to event lines (for example, 5 lines for 5 bits of information) that were used by the analog instruments to provide a limited set of instructions (i.e., 32 total instructions for all instruments) to these instruments during high speed operation of the sequence controller. The majority of changes in the operation of the analog instruments were thus made by the primary control test computer between high speed tests of the CUT.

SUMMARY OF THE INVENTION

It has been discovered that analog instrumentation in a mixed digital and analog circuit tester could be controlled with more flexibility and to perform more functions during a test pattern, and that instrumentation could be added to the system with little hardware changes, by providing the analog instruments with associated RAM loaded with microcode and connected to a sequence bus controlled by an address generator of a sequence controller. Instructions can thus be advantageously simultaneously presented to each of the instruments at the CUT clocking rate. Additional instruments can be easily added and controlled by providing microcode for them and connecting their microcode RAMs to the sequence address bus. Programming of the instruments by the user is facilitated, as the instruments' instructions are simply additional microcode bits in the test vector.

In preferred embodiments, the analog instruments include high frequency and low frequency analog signal generators and capture digitizers and associated memory; there also are instruments that provide and detect digitized representations of analog signals and have microcode RAM addressed by the sequence address bus; the sequence address bus includes pipeline registers to sequentially advance address information along the sequence address bus from the address generator; and there is a clock RAM connected to the sequence address bus and an associated clock generator.

Other advantages and features of the invention will be apparent from the following description of a preferred embodiment thereof and from the claims.

DESCRIPTION OF THE PREFERRED EMBODIMENT

The preferred embodiment will now be described.

DRAWINGS

STRUCTURE

Figure 1:
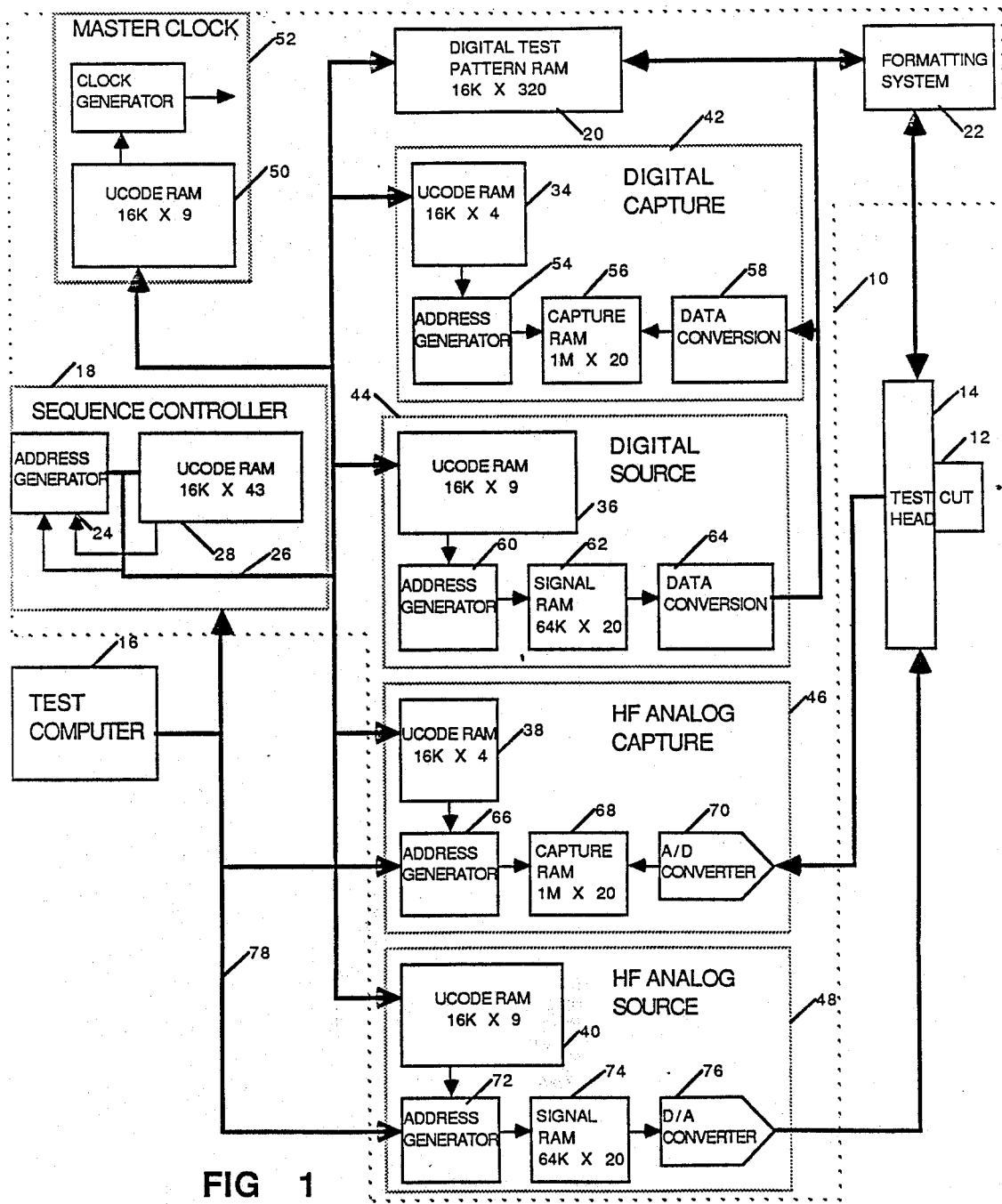
FIG. 1 is a block diagram of an automatic circuit tester according to the invention.

Referring to FIG. 1, there is shown automatic circuit tester 10 for testing circuit under test ("CUT") 12, electrically connected to test head 14. Test computer 16 provides overall control of the apparatus, including sequence controller 18, which is used to simultaneously deliver a large number of data to CUT 12, using digital test pattern RAM 20 (16K by 320 bits) and formatting system 22, and provide control signals to the rest of the tester synchronously with the clocking of CUT 12 at its high rate, e.g., 25 MHz. Sequence controller 18 includes address generator 24 connected to 14-bit sequence address bus 26 and sequence microcode RAM 28 (16K by 43 bits), containing the control bits for the control signals for the tester and for sequence controller address generator 24. Sequence address bus 26 is connected to digital test pattern RAM 20 and to microcode RAMS 34 (16K by 4 bits), 36 (16K by 9 bits), 38 (16K by 4 bits), 40 (16K by 9 bits) of digital capture instrument 42, digital source instrument 44, high frequency analog capture instrument 46, and high frequency analog source instrument 48, respectively. Address bus 26 is also connected to clock microcode RAM 50 of master clock subsystem 52.

Address bus 26 also contains a condition bit that allows events in instruments 42, 44, 46, 48, clock 52, and digital test pattern RAM 20 to affect the address generated by sequence controller address generator 24. Events at CUT 12 may also affect the address generator 24 by way of the formatting system 22, test pattern RAM 20 and the condition bit in the address bus 26.

Digital capture microcode RAM 34 is connected to provide instructions to its associated address generator 54, which in turn provides addresses to its associated capture RAM 56 (1M by 20 bits), used to store the digital output data captured from CUT 12 after the data has been routed by formatting system 22 and converted by conversion subcircuit 58 to a form in which it is stored in RAM 56. Similarly, digital source microcode RAM 36 is connected to provide instructions to its associated address generator 60, which in turn provides addresses to its associated signal RAM 62 (64K by 20 bits), loaded with a digital representation of an analog waveform; signal RAM 62 is connected to read out the digitized signal to its associated data converter 64, which converts the data to a form to be presented to formatting system 22. High frequency analog capture microcode RAM 38 is similarly connected to provide instructions to its associated address generator 66, which in turn provides addresses to its associated capture RAM 68 (1M by 20 bits), used to store digitized representations of the sensed analog output from CUT 12 provided by A/D converter 70. High frequency analog source microcode RAM 40 is similarly connected to provide instructions to its associated address generator 72, which provides addresses to signal RAM 74 (64K by 20 bits), loaded with a digital representation of an analog signal; signal RAM 74 is connected to read out the digitized signal to D/A converter 76, which provides an analog signal to CUT 12. High frequency analog source instrument 48 thus is an analog signal generator, and high frequency capture instrument 46 includes a capture digitizer and associated memory.

Tester 10 also includes a low frequency analog capture instrument and a low frequency analog source instrument (not shown) similar to instruments 46 and 48 and connected to sequence address bus 26, the main differences being that the A/D and D/A converters operate at low instead of high frequencies. Address generators 66, 72 of analog instruments 46, 48 are connected to 16-bit test computer address bus 78 for control by test computer 16 when sequencer 18 is not carrying out high speed testing. Pipeline registers (not shown) are distributed along sequence address bus 26 and throughout tester 10 along the paths from microcode RAMs to sources of signals actually presented to CUT 12; the pipeline registers sequentially advance addresses along sequence address bus 26, and addresses and other digital signals along other paths.

OPERATION

In operation, microcode RAMs 28, 34, 36, 38, 40, 50 are loaded with their respective instructions, and signal RAMs 62, 74 are loaded with their respective digitized analog signals, all under the control of test computer 16. Other instructions are passed from test computer 16 to elements of the tester 10, and digital test patterns are loaded into digital test pattern RAM 20, also prior to high speed testing of CUT 12.

During high speed testing under the control of sequence controller 18, addresses provided to sequence address bus 26 by address generator 24 cause instructions to be provided to the instruments from their associated microcode RAMs synchronously with the delivery of data to CUT 12 at its clock rate. The digital test patterns stored in digital test pattern RAM 20 provide the data for the clock and control signals and for detecting the resulting digital outputs for CUT 12. The instruments provide analog signals and analog signals in digital form to CUT 12 and detect resulting outputs. Master clock 52 provides programmable clocking for the rest of apparatus 10.

Events in instruments 42, 44, 46, 48, clock 52, and test pattern RAM 20 may affect the address generated by sequence controller address generator 24, by way of the condition bit in address bus 26. Events in CUT 12 may also affect the address generated by sequencer address generator 24, by way of formatting system 22 and digital test pattern RAM 20.

Which instruments are actually used during a test depends on the type of CUT 12 and its functions being tested. In general, digital source instrument 44 is used with an analog capture instrument (e.g., instrument 46), and an analog source instrument (e.g., instrument 48) is used with digital capture instrument 42. In addition, digital capture instrument 42 might be used with digital source instrument 44, and an analog source instrument could be used with an analog capture instrument.

Testing devices with substantial analog and digital capabilities, e.g., codecs, modems, Ethernet transceivers, integrated services data network (ISDN) devices, and digital video and audio components, commonly involves simultaneous use of digital test pattern RAM 20, digital capture and source instruments 42, 44, high frequency analog capture and source instruments 46, 48, and low frequency analog capture and source instruments (not shown). When it is necessary to provide additional digital and analog source and capture capabilities, additional digital and analog instruments identical or similar to those shown on FIG. 1 are added, their associated microcode RAMs being connected to sequence address bus 26 and their outputs or inputs being connected to test head 14.

Figure 2:
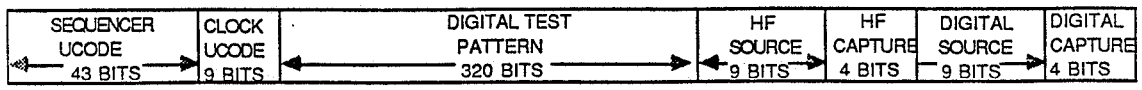
FIG. 2 is a diagram of a test vector format for the FIG. 1 apparatus.

FIG. 2 shows the format of a vector, including data and microcode, for tester 10. As can be seen, the microcode is distributed throughout the system. Sequencer 18 has 43 bits of microcode, master clock 52 has 9 bits of microcode, and the various instruments have their own associated bits of microcode as indicated. Instructions can thus be presented to each of the instruments at the clocking rate of the circuit under test during high speed testing, permitting more flexibility and the instruments to perform more functions during a test pattern than when event lines are used. In addition, as already mentioned, additional instruments can be easily added to the apparatus by providing microcode for them and connecting their microcode RAMs to the address bus. This microcode format also greatly facilitates programming by the user.

OTHER EMBODIMENTS

Other embodiments of the invention are within the scope of the following claims. For example other instruments besides those shown on FIG. 1 can be used in or added to the automatic circuit tester.

What is claimed is:

1. Apparatus for providing high speed control of digital test patterns and analog instruments in automatic circuit testing apparatus for providing digital and analog test signals to and sensing responses from a circuit under test comprising a sequence controller including a sequence random access memory (RAM) loaded with microcode and a sequence address generator means for generating sequence addresses and selectively addressing instructions in said sequence RAM at the clock rate of said circuit under test, a sequence address bus connected to the sequence address generator to distribute sequence addresses appearing on it, a digital test pattern RAM connected to be addressed by said sequence addresses on said sequence address bus, said digital test pattern RAM being loaded with digital test patterns to be applied to said circuit under test, and analog instruments including associated instrument RAMs loaded with microcode for the instruments and connected to be addressed by sequence addresses on said sequence address bus.

2. The apparatus of claim 1 wherein said analog instruments include an analog signal generator and a capture digitizer and associated memory.

3. The apparatus of claim 2 wherein said analog instruments comprise high frequency and low frequency signal generators and capture digitizers and associated memories.

4. The apparatus of claim 1 further comprising instruments that provide and detect digital representations of analog signals and have associated RAMs loaded with microcode and connected to said sequence address bus.

5. The apparatus of claim 2 wherein said analog signal generator comprises a signal microcode RAM connected to said sequence address bus, a signal address generator provided with instructions from said signal microcode, a signal RAM loaded with digitized analog signals and addressed by said signal address generator, and a D/A converter.

6. The apparatus of claim 1 wherein there is a clock RAM loaded with microcode for the clock and connected to said sequence address bus and a clock generator controlled by said microcode in said clock RAM.

7. The apparatus of claim 1 wherein said sequence address bus includes pipeline registers to sequentially advance address information along the address bus from the address generator upon clocking.

8. The apparatus of claim 1 wherein said sequence address bus includes a condition bit that can be used to affect the address generated by the sequence address generator.

* * * * *